United States Patent [19]
Peterson

[11] Patent Number: 5,805,425
[45] Date of Patent: Sep. 8, 1998

[54] MICROELECTRONIC ASSEMBLIES INCLUDING Z-AXIS CONDUCTIVE FILMS

[75] Inventor: Robert K. Peterson, Garland, Tex.

[73] Assignee: Texas Instruments Incorporated, Dallas, Tex.

[21] Appl. No.: 718,885

[22] Filed: Sep. 24, 1996

[51] Int. Cl.⁶ .................................................. H05K 1/14
[52] U.S. Cl. .................. 361/769; 257/703; 257/720; 439/66; 439/91; 361/783; 361/773; 361/774; 361/776
[58] Field of Search .................. 257/703, 720; 439/66, 91

[56] References Cited

U.S. PATENT DOCUMENTS

| | | | |
|---|---|---|---|
| 5,019,944 | 5/1991 | Ishii et al. | 361/783 |
| 5,286,417 | 2/1994 | Mahmoud et al. | 252/518 |
| 5,431,571 | 7/1995 | Hanrahan et al. | 439/91 |
| 5,543,949 | 8/1996 | Machida et al. | 359/75 |
| 5,613,862 | 3/1997 | Naylor | 439/91 |

OTHER PUBLICATIONS

IBM Technical Disclosure Bulletin vol. 30, No. 9, Feb. 1988.

*Primary Examiner*—Leo P. Picard
*Assistant Examiner*—David Foster
*Attorney, Agent, or Firm*—Gary C. Honeycutt; Rene E. Grossman; Richard L. Donaldson

[57] ABSTRACT

First and second electronic parts interconnected by a nonconductive nanoporous film having first and second parallel surfaces, said film having metal-filled pores extending through the thickness of the film, such that each of said parts is contacted by the metal in at least several pores, a number of the pores being perpendicular to the surfaces of the film, and other pores being oblique to the surfaces of the film, whereby thermal dissipation is enhanced in the plane of the film.

6 Claims, 3 Drawing Sheets

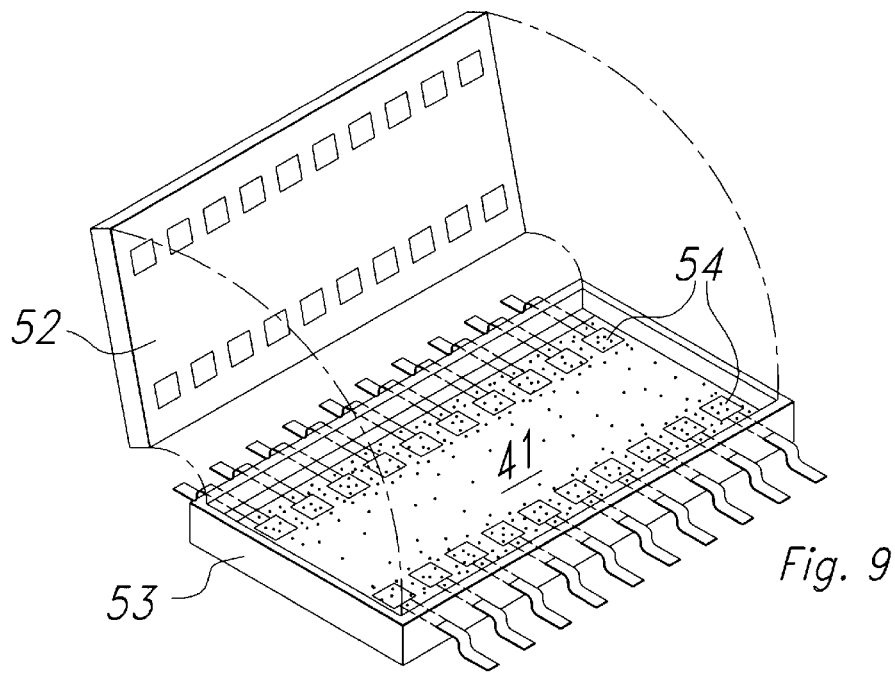
Fig. 9
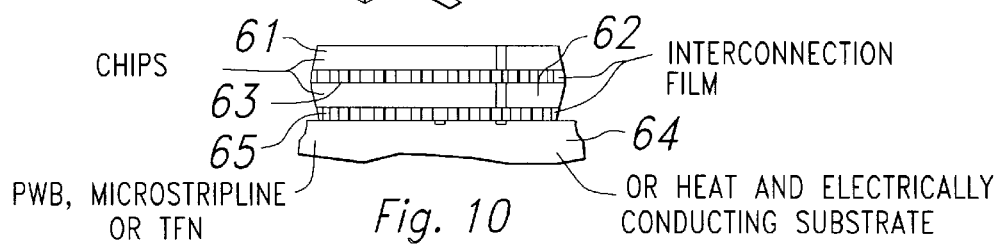
CHIPS 61  62 INTERCONNECTION FILM
63
65  64
PWB, MICROSTRIPLINE  OR HEAT AND ELECTRICALLY
OR TFN  Fig. 10  CONDUCTING SUBSTRATE
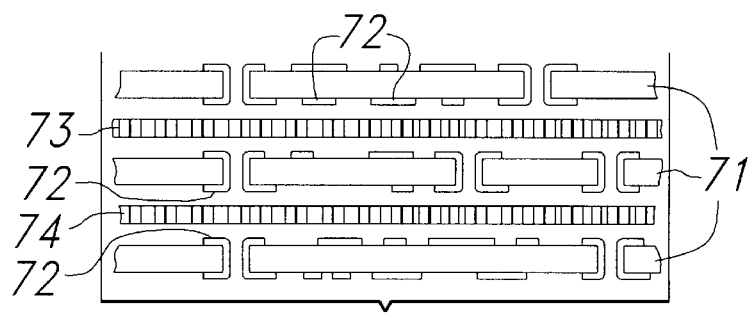
Fig. 11
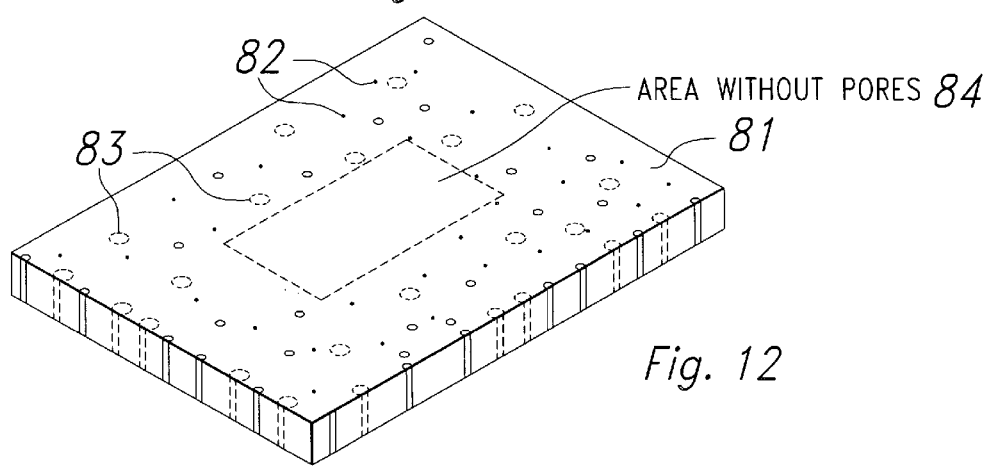
AREA WITHOUT PORES 84
Fig. 12

MICROELECTRONIC ASSEMBLIES INCLUDING Z-AXIS CONDUCTIVE FILMS

This invention relates to the assembly and packaging of micro-electronic devices, including semiconductor circuit chips, printed circuit boards, thin-film networks (TFN's), and multi-chip circuit modules; and more particularly to novel means for interconnecting such devices and modules, electrically and/or thermally.

BACKGROUND

The effort to provide more reliable, more cost-effective means for interconnecting microelectronic devices has been underway for at least thirty years. The need for such improvement has become steadily greater because of the long-term trend toward greater circuit density, and the consequent need to reduce the size of bonding pads on a circuit chip, and to narrow the spacing between pads.

Virtually all semiconductor devices are assembled with the use of wire bonding to provide ohmic interconnections to the metal pads on the circuit chip. Currently available wire bonders require at least 6 mils spacing from the center of one pad to the center of an adjacent pad. This limitation has blocked further reductions in the size of a circuit chip, and further increases in circuit density. This and other limitations of wire bonding have been known for several decades; and yet, there is no apparent hope for a breakthrough in wire bonding that would accommodate dramatic reductions in the size and spacing of bonding pads.

Efforts to replace wire bonding have included the use of "high density interconnect" structures, using synthetic resin films having metal patterns that extend along one surface of the film and extend through via holes in the resin film for making ohmic contact with underlying pads on a circuit chip. See for example Gorczyca et al, U.S. Pat. No. 5,161,093. Such prior configurations do not address the need to develop packaging for chips having greater circuit density, nor the need for interconnecting with smaller pads and closer pad spacing on each chip; but instead are directed to multichip interconnections, using chips of known design.

IBM and others have used solder bonding of inverted chips, as an alternative to wire bonding; but no such soldering technique has permitted the use of smaller pads and closer spacing between pads.

More recently, elastomeric polymer films having multiple, metal-filled apertures have been developed for electrical connections, but the metal filling has consisted of either 1) discrete particles (usually spherical) or 2) a single sphere having a diameter substantially the same as the thickness of the polymer film, such that the sphere can readily be exposed at both surfaces of the film. The particle-filled films have not been satisfactory, because the particle-to-particle surface contact area within the film is extremely limited, causing excessive electrical and thermal resistance at each contact point; and because the surface contact area between a particle and a bonding pad is also very limited. The sum of all these tangential, high-resistance contact points gives the interconnection a poor performance rating.

The single sphere approach is also unsatisfactory, because the surface area of the contact point with the sphere, on each side of the film, is too small; and because the final film thickness is fixed by the diameter of the spheres, and thus the film cannot readily be deformed to accommodate the need for a non-uniform thickness range. The use of deformable, gold-coated polymer spheres randomly distributed within a polymeric adhesive has been tried, but each gold-coated sphere had a diameter about the same as the width of a single bonding pad, which gave an unreliable result. Moreover, adjacent spheres could not be kept apart, and there was no potential for substantially reducing the space between bonding pads.

An elastomeric connector block comprising a plurality of laminated silicone sheets, with parallel gold traces deposited on the surface of each sheet, has provided electrical connection between circuit boards having terminal pads with a minimum width of 15 mils, which is far too large for connecting pads on an integrated circuit chip.

No anisotropically conductive film has had the potential to replace wire bonding, and to replace other means for the interconnection of electronic parts, until now.

SUMMARY OF THE INVENTION

One aspect of the invention is embodied in an assembly of two or more microelectronic parts, wherein electrical and/or thermal interconnection between the parts is achieved by means of multiple, discrete, conductive nanoscopic fibrils or tubules fixed within the pores of an insulating film. The pores are usually perpendicular, or substantially perpendicular to the plane of the film, and extend through the complete thickness of the film. Such a film is said to have anisotropic electrical conductivity, i.e., Z-axis conductivity, with little or no conductivity in the other directions.

The insulating film of the assembly is selected from various materials, including synthetic resin films, also known as polymeric membranes. In addition to thermal and electrical connection, such films are also capable of providing structural connection between parts, for example, by adhesively bonding the parts together, and thereby permanently fixing the tips of the metal fibrils in contact with the parts. Alternatively, the parts may be held together with a non-bonding Z-axis film (such as a silicone polymer)in between, by pressure alone, using any suitable clamping mechanism. Such an alternative allows the parts to be readily separated, for the purpose of replacement or repair, etc. Useful silicone polymers include the dialkyl-, alkyl-alkylene-, diaryl-, and aryl-alkyl-polysiloxanes, such as dimethyl polysiloxane, or methyl vinyl polysiloxane.

A single integrated circuit chip having more than one thousand bonding pads, for example, is now readily packaged, using the interconnection system of the invention. Also, two or more such circuit chips are readily interconnected with each other in accordance with the invention. Or, one or more circuit chips comprising active components may be mounted upon and interconnected with ohmic contacts on a passive substrate. Instead of a passive substrate, one or more circuit chips may be mounted upon and interconnected with ohmic contact pads on a printed circuit board, or a microstrip line, or TFN, or a package base. Such permutations and combinations are virtually endless, all of which are included within the scope of the invention.

One example of a suitable Z-axis conductive film useful in accordance with the invention is a synthetic resin membrane having nanometer-sized pores extending through the film, from one membrane surface to the other surface, and having at least some of its pores filled with a conductive material or composition, such as gold or other metals, or with one or more nonmetallic conductive materials. The thickness of the film is within the range of about five microns, up to about 10 mils. The dimensions of the film and the metal fibrils ensure good performance at 50 GHz and higher frequencies.

The nanoscopic pore diameter in such a membrane is much smaller than the smallest spacing between contact pads on a circuit chip; and therefore no electrical shorting between adjacent contacts can be caused by such metal-filled pores, regardless of chip orientation or alignment. For purposes of this disclosure, the terms "nanoscopic", "nanoporous" and "nanometer-sized" include diameters within the range of about 1 nanometer, up to about 10,000 nanometers (10 microns), and preferably from 10 nanometers to 1,000 nanometers (1 micron).

For example, on a chip having one thousand contact pads, a suitable spacing between pad centers is about 0.5 mil, or about 12.5 microns, which equals 12,500 nanometers. Thus, the tip of a metal fibril fixed within a pore having a 10-nanometer diameter covers or contacts only 1/1250th of the distance between pad centers. For pads having a width of 0.2 mil, and a center-to-center spacing of 0.3 mil, the space between edges of adjacent pads is 0.1 mil, or 2,500 nanometers. Such a metal fibril tip would contact only 1/250th of the space between pad edges. A 100-nanometer fibril tip would span only 1/25th of the space between pads.

A distinguishing feature of the preferred nanoporous films used in accordance with the invention is the aspect ratio of the pores. That is, for a one-mil-thick film, each pore length is one mil, or about 25,000 nanometers; and thus, for a pore diameter of 10 nanometers, the aspect ratio is 2500:1. The range of suitable aspect ratios for use in the invention is from about 2:1 up to about 20,000:1, and preferably from about 10:1 to about 1,000:1.

A further advantage of the invention lies in the fact that precise alignment of the interconnect film with other parts is not required, in order to achieve a desired ohmic interconnection. Acceptable alignment is achieved when some portion of each pad on a chip is aligned with some portion of its counterpart on a substrate or other part to which bonding is desired, provided no overlap with an adjacent pad is allowed.

For the dissipation of heat, thermal interconnection between parts is achieved in the same manner as described above for electrical interconnection, except that the nanopores are filled with a material having high thermal conductivity. Further, in order to maximize thermal conductivity, the number and/or size of the pores is increased, so that a high percentage of the membrane volume consists of the filled pores. For example, a membrane consisting of 20% gold by volume has a Z-axis conductivity approaching 60 W/M degree C., whereas a commercial adhesive, designed for heat dissipation, has a thermal conductivity of only 5 W/M degree C.

If electrical connection is not desired, in addition to heat dissipation, the material in the pores is selected from electrically nonconductive materials having a high thermal conductivity, such as diamond, carbon, or boron nitride, for example.

Nanoporous films of the type used in practicing the invention are commercially available for use as nanofiltration membranes. They are made, for example, by exposing a nonporous resin film to accelerated particles having sufficient energy to pass through the entire thickness of the film, followed by selective chemical etching to remove the particle-damaged tracks, and thereby create nanopores through the complete thickness of the film. The etching step may also remove small amounts of the surrounding undamaged film.

Such methods have produced films having pores as small as 5 nanometers in diameter, and pore densities of 1,000 pores/cm squared, up to and exceeding 10 to the ninth power pores per square centimeter. Polycarbonate and polyester resin films having such pore specifications are available from Nuclepore, Inc., and from Poretics Corp. One example is the polycarbonate screen membrane from Poretics, Catalog No. 19368PCTE. This polymer is derived from the carbonate of bisphenol-A Other methods for producing such nanoporous films include the use of lasers, x-rays, gamma rays, or electron beams to burn nanoscopic damage tracks and/or holes through a resin film. Selective chemical etching is then used to create nanoscopic pores, or to enlarge the holes in the film. The pores are then filled with a metal or other conductor by electroplating, electroless plating, or vapor deposition. Excess metal formed on the membrane surface or surfaces is then removed, whereby the only remaining metal is located in the pores.

If desired, the membrane is then exposed to an etchant that does not attack the metal, so that a small amount of the membrane surface surrounding the tips of the metal fibrils is removed, thereby providing tips that extend slightly above the remaining membrane surface. The exposed tips may then be tinned with solder, to achieve solder contact with the pads of a circuit chip or substrate, etc., if desired. It has been demonstrated, however, that reliable electrical interconnection is achieved by contact alone, without solder bonding or any other form of fixed attachment to the tips of the metal nanofibrils used in accordance with the invention.

Methods for plating and filling the inside of such nanopores have been developed by Dr. Charles R. Martin et al, as reported in the following articles:

"Nanomaterials: A Membrane-Based Synthetic Approach," Science, Vol 266, pages 1961–6, Dec. 23, 1994

"Template Synthesis of Metal Microtubule Ensembles Utilizing Chemical, Electrochemical, and Vacuum Deposition Techniques," J. Mater. Res., Vol 9, No. 5, Pages 1174–83, May 1994

"Fabrication and Evaluation of Nanoelectrode Ensembles" Analytical Chemistry, Apr. 15, 1995

"Metal Nanotubule Membranes With Electrochemically Switchable Ion-Transport Selectivity", Science, Vol 268, May 5, 1995

"Preparation and Electrochemical Characterization of Ultramicroelectrode Ensembles," Analytical Chemistry, Vol 59, No. 21, Pages 2625–30, Nov 1, 1987

Each of the above-cited articles is incorporated herein by reference. A copy of each article is included herewith.

The use of single nuclear particle guns, lasers, x-rays or electron beams to generate the damage tracks or holes allows convenient patterning of the pore locations. For example, the pores may be arranged in a rectangular or triangular pattern; and moreover, selected surface areas without pores may be provided, so that conductive thin film patterns may be fabricated on such surface areas of the membrane, for current propagation in x-y directions, conbined with z-axis conduction in other areas of the same membrane. The same result can be achieved, beginning with a random distribution of pores, by selectively masking portions of the membrane surface during etching or plating.

Polymeric membranes used in accordance with the invention include both thermoplastic and thermosetting polymer films. For example, upon heating the combination of an electronic device in contact with a metal-filled, nanoporous thermoplastic membrane, the softening of the plastic causes an adhesive bonding of the device to the membrane, thereby holding the tips of the metal fibrils in contact with the device.

A thermosetting polymeric membrane having metal-filled pores is also useful for the same purpose, except that the heating step causes a permanent hardening (cure) of the film, thereby bonding the devices to the surface of the membrane, and holding the fibril tips in place.

For certain applications, an elastomeric film composition is preferred. The surface of such a film will conform completely with the microscopic irregularities of a circuit surface, and thereby permit maximum contact area between each film surface and each circuit or substrate surface. Such a film interface also causes virtually all the metal fibril tips to make good contact with the circuit surface, including each bonding pad, on both sides of the film. The net result is a very low resistance interconnection.

For example, in a membrane having a high pore density, the filled pores represent more than 20% of the composite film volume. Thus, at least 20% of each bonding pad area is contacted with metal, which ensures a very low resistance connection.

Also, a pressure-sensitive adhesive surface can be prepared by using a pressure-sensitive adhesive film, or by coating the membrane with a tackifier, such as silicone polymer. Such a tacky surface holds circuit chips in place on the surface of the membrane.

The Z-axis conductive films of the invention have the additional advantage of enabling a reliable interconnection of parts that are not perfectly planar. That is, all the contact pads on a device surface are normally designed to lie in precisely the same plane. But if one or more of the pads deviate from the plane, defective or unreliable bonding can result. Now, such nonplanar pads can be reliably bonded, since the films of the invention exhibit a sufficient plastic "flow" to engage all such pads. When the film is thus deformed, some deformation of the metal fibrils also occurs. Because of the high aspect ratio of the metal fibrils, such deformation introduces no adverse effect.

In order to further enhance membrane flow, a large number of pores may be kept open, i.e., unfilled. This allows the film to exhibit compressibility, which is not characteristic of a normal polymeric film.

Still further, by careful selection of the composition of the polymer, the x-y and/or z coefficient of thermal expansion (CTE) for the membrane can be approximately matched with the CTE of the parts bonded thereto. More specifically, the CTE can be matched with that of silicon, metals and ceramics, such as used in the fabrication of microelectronic semiconductor devices, to provide improved reliability. Liquid crystal polymers and rigid rod polymers are particularly suited for this purpose, including Vectra from Hoechst, xyDAR from AMOCO, Poly X from Max Dern, PIBO from Dow, and certain polyimides from DuPont.

The following polymer compositions are among those suitable for use in accordance with the invention:

| THERMOPLASTIC FILMS FOR INTERCONNECTS | | | | | | |
|---|---|---|---|---|---|---|
| Plastic | Tg | CTE | Tm | Loss | % H$_2$O | Comments |
| Vectra LCP Hoechst FA-X100-30 | 160 | −5to75 | 285C | .002 | .02 | Production PWB and bond film |
| Polyphenylene Maxdem | 150 | 5to 25 | | .005 | .25 | Pilot Plant |
| Dupont LCP | 200 | | | | | Piolt Plant Foster M |
| XYDAR LCP (AMOCO) | 250 | 5 to44 | 320 | | .1 | |
| Polycarbonate (GE, Mobay) | 150 | 67 | 160 | .006 | .35 | Present Film |
| Polysulfone (AMOCO) "Thermalux" film extruded by Westlake | 150 | | | .004 | | |
| PEEK (ICI) | 144 | | 334 | | | Very crystalline |
| Polyester PBT | 130 | 80 | | | .08 | |
| Polyester PET | 80 | | | | | |
| PEI Ultem 1000 (GE) extruded by Westlake | 200 | 54 | 250 | .002 | .25 | |
| Polyacrylate Hoechst | 170 | | | | | |
| PEK (ICI) | 162 | | 373 | | | Discontinued |
| PEKK (Dupont) | 156 | | 305 | | .2 | |
| PES (BASF, AMOCO) | 220 | 60 | 383 | | | |
| Polyketone | | | 220 | | VeryLow | Shell, Mod Plas, Mar |
| PEEKK (Hoechst) | 162 | | 373 | .003 | 1.8 | |
| PAEK (AMOCO) | | | | | | |
| PEKEKK (BASF) | 173 | | 371 | | | |
| PPSU (AMOCO) | 220 | | | | | |
| Silicone pressure sensitive Film, Specialty Tapes CW-14HT or CW-1050 | 260 | | | | | |

| THERMOSET BOARDS AND BOND FILMS | | | | | | |
|---|---|---|---|---|---|---|
| Plastic | Tg | CTE | Tm | Loss | % H$_2$O | Comments |
| R04000 BDN STYRENE Rogers & TI Bond film to be available soon | 280 | 13 | | .002 | .06 | PWB Film |
| Polyimide DuPont P12610D | 400 | 3 | | .002 | .6 | Spin on |
| PIBO (Dow) | >400 | 5 | | | | Film, spin |
| Speedboard Adhesives (Gore) | | | | | | C-Staged Adhesive Film |

BRIEF DESCRIPTION OF THE DRAWINGS

FIG. 9 is a top view of a package base and an integrated circuit chip to be mounted therein according to the invention.

FIG. 10 is a cross-sectional view of two circuit chips, interconnected with each other in accordance with the invention.

FIG. 11 is a cross-sectional expanded view of an assembly comprising a plurality of printed circuit boards interconnected with the Z-axis film of the invention.

FIG. 12 is a perspective view of a Z-axis conductive film, used to form interconnections in accordance with the invention.

DETAILED DESCRIPTION

Figure 1:
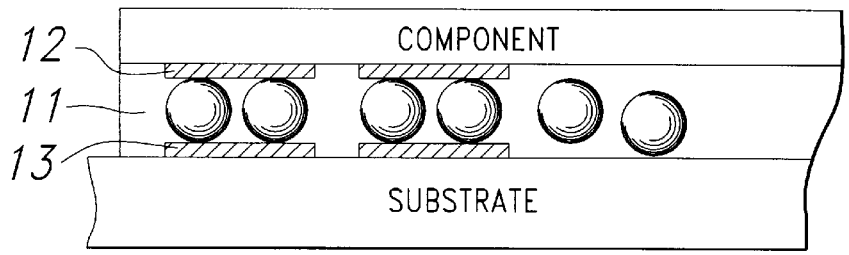
FIG. 1 is a greatly enlarged cross-sectional view of a prior anisotropically conductive microelectronic connection, using a polymeric adhesive film having 40-micron metal spheres distributed therein.

As shown in FIG. 1, the prior use of 40-micron metal spheres 11 within a polymeric adhesive film is unsatisfactory, because the sphere provides a very small surface contact area with bonding pads 12 and 13. Although the pads have polished surfaces, nanoscopic irregularities remain, making it more difficult for spheres 11 to achieve good contact. Because the contact area is very small, low-resistance contact is impossible. Even the use of three or more spheres per pad will not correct this problem. A contact pad is not large enough to permit contact with more than three or four such spheres. Moreover, the spheres do not enable adequate tolerance or adjustment to the bonding of nonplanar surfaces.

Figure 2:
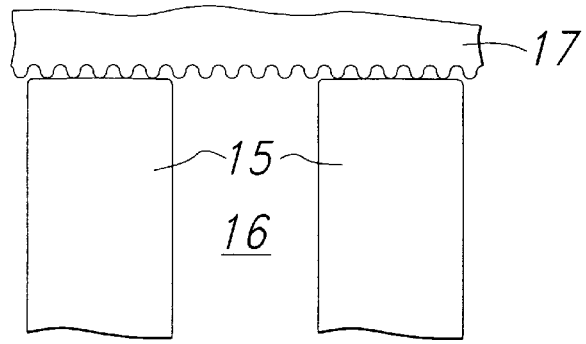
FIG. 2 is a greatly enlarged cross-sectional view of a microelectronic connection interface in accordance with the invention, using a microporous polymeric Z-axis conductive film having a 5-micron diameter gold fibril fixed within each film pore.

As shown in FIG. 2, one embodiment of the present invention includes the use of 5-micron diameter metal fibrils 15 within each pore of film 16, such that multiple fibril tips make contact with pad 17. Although a single fibril tip may not provide substantially more surface contact area with the pad than sphere 11, the key difference is that 230 fibril tips will fit within the same pad area that accommodates only three of the spheres. Thus, the total resistance of the contact in FIG. 2 is substantially less than the total resistance of the contact in FIG. 1; and may be only 1/50th or 1/100th as great.

Figures 3, 4:
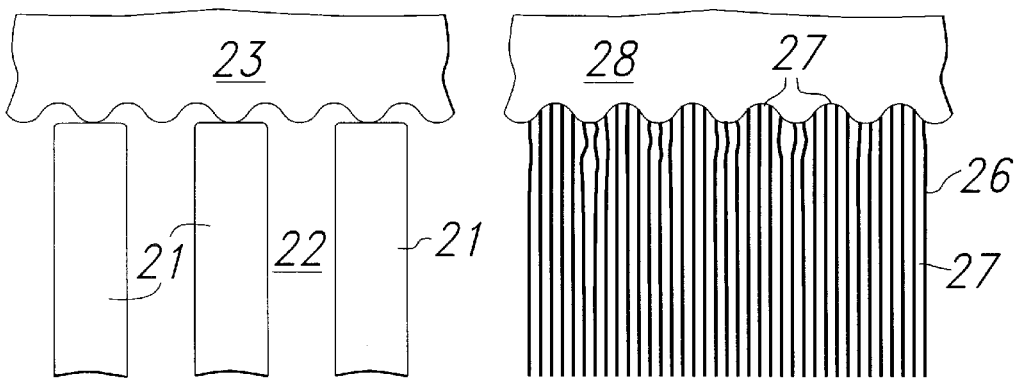
FIG. 3 is a greatly enlarged cross-sectional view of a microelectronic connection interface in accordance with the invention, using a nanoporous polymeric Z-axis conductive film having a 0.375-micron diameter gold fibril fixed within each film pore.
FIG. 4 is a greatly enlarged cross-sectional view of a microelectronic connection interface in accordance with the invention, using a nanoporous polymeric Z-axis film having a 25-nanometer diameter gold fibril fixed within each pore.

As shown in FIG. 3, another embodiment of the invention includes the use of 0.375-micron diameter metal fibrils 21 within the pores of film 22, for making electrical contact with pad 23.

Even though each fibril may contact only a single point on pad 23, the number of fibril tips that contact a single pad exceeds 40,000. Thus, the total resistance of the contact in FIG. 2 is much greater that the total resistance of the contact in FIG. 3.

As shown in FIG. 4, nanoscopic metal fibrils 26 within polymer film 27 have a diameter of ony 25 nanometers, such that the tips are readily capable of entering each of valleys 27 in the surface of pad 28. This intimate contact, in combination with the large number of fibrils that contact each pad, provides an even lower resistance contact than the embodiment of FIG. 3, and is comparable with the resistance characteristic of an alloyed wire bond. Still further, the dynamic thickness range of the film is greater, due to the greater aspect ratio of the film pores, and the greater degree of deformability of the metal fibrils in the pores. Actual contact resistance is a function of a number of parameters, including fibril deflection force, malleability of the metal, surface roughness, planarity of the parts, and others.

Figure 5:
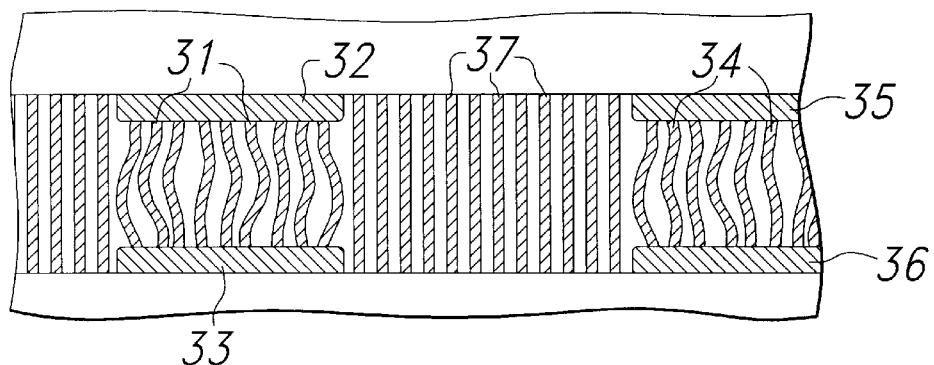
FIG. 5 is a greatly enlarged cross-sectional view of plural microelectronic interconnections in accordance with the present invention, using a nanoporous polymeric Z-axis film having a 25-nanometer gold fibril within each pore.

As shown in FIG. 5, the film used in accordance with the invention is capable of deforming under pressure to fill the entire space between circuit parts. Consequently, nanoscopic fibrils 31 readily deform, as a result of film compression between pads 32 and 33. Similarly, fibrils 34 readily deform, as a result of film compression between pads 35 and 36. The remaining fibrils 37 are not compressed, and they make no electrical contact, but they do serve to conduct heat.

Figure 6:
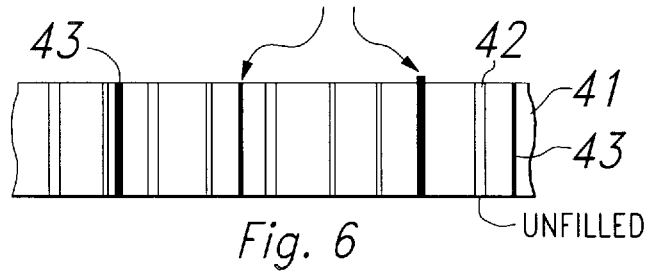
FIG. 6 is a cross-sectional view of a nanoporous resin film having some orthogonal pores filled with gold fibrils.

As shown in FIG. 6, an example of the interconnection means of the invention comprises synthetic polycarbonate resin membrane 41 having a thickness of 1 mil, and up to one million or more parallel nanoscopic pores 42, each pore having a diameter of about 30 nm, at least some of which are filled with gold nanofibrils 43. Many other membrane compositions are useful in accordance with the invention, as well as many other dimensional specifications. For electrical conductivity, the gold may be replaced with another metal or other conductive material, including copper, platinum, nickel, and silver, for example. Conductive polymers are also useful nanofibrils for some applications, including polyacetylene, polypyrrole, polythiophene, and polyaniline, for example.

Polysilicone membranes are particularly useful in that they have a low elastic modulus which allows the film to accommodate the deflections or deformations associated with the bonding of contact pads on nonplanar surfaces; and also allows greater tolerance to the interconnection of parts having different coefficients of thermal expansion.

Figure 7:
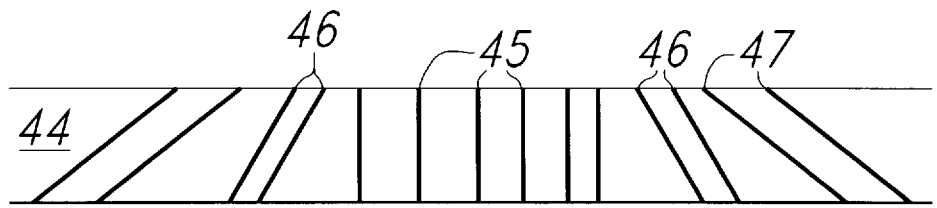
FIG. 7 is a cross-sectional view of a nanoporous resin film having oblique and orthogonal pores filled with gold fibrils.

As shown in FIG. 7, another example of the interconnection means of the invention comprises synthetic polyester membrane 44 having a thickness of 1 mil, a first multiplicity of parallel nanoscopic pores 45 orthogonal to the membrane surface, a second multiplicity of parallel nanoscopic pores 46 sloped at a substantial angle with respect to pores 45, and preferably a third multiplicity of nanoscopic pores 47, sloped at a substantial angle with respect to both pores 45 and 46. Pores 45 are filled with gold, for example, for the purpose of electrical conduction, while the other pores are filled with a material having greater thermal conductivity than gold, but electrically nonconductive, such as diamond, for example, so that greater heat dissipation is achieved, especially in the x-y directions, compared with the example of FIG. 1.

Figure 8:
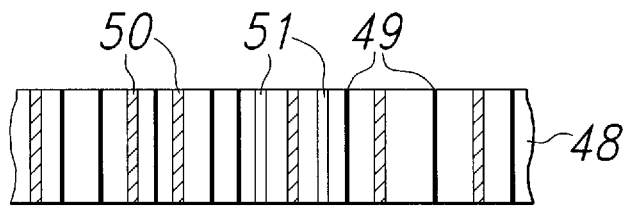
FIG. 8 is a cross-sectional view of a nanoporous resin film having selected pores filled with gold, and other pores filled with a thermally-conductive dielectric material.

As shown in FIG. 8, another variation of the interconnection membrane comprises synthetic resin film 48 having pores 49 filled with gold, pores 50 filled with a material having greater thermal conductivity than gold, and pores 51 left open, for the purpose of allowing the membrane to exhibit compressibility, and a lower apparent modulus of elasticity than is characteristic of a nonporous membrane having the same composition.

As shown in FIG. 9, a single circuit chip 52 is inverted within package base 53 such that contact pads on the face of the chip are electrically interconnected with pads 54 of base 53, by means of membrane 41, separately illustrated in FIG. 1. No alignment of membrane 41 is required, except to cover all of pads 54, since all portions thereof include gold-filled pores. Approximate alignment of the chip is required, only to ensure that some portion of each contact pad is vertically oriented over some portion of the corresponding pad on base 53. The chip is held in place by the top of the package, (not shown) which is designed to apply pressure to the chip, when the package is fully assembled. Or, membrane 41 is selected to function as an adhesive by itself, with or without first applying heat to soften the membrane surface, so that a permanent chemical bonding of the membrane to both the chip and the package base occurs.

As shown in FIG. 10, two circuit chips 61 and 62 are readily interconnected by means of nanoporous anisotropically conductive membrane 63 having at least some of its pores filled with gold or other conductor. The chips are interconnected with substrate 64 by means of nanoporous anisotropically conductive membrane 65.

As shown in FIG. 11, a plurality of circuit boards 71 having contact pads 72 are readily interconnected by means of Z-axis conductive films 73 and 74, respectively.

As shown in FIG. 12, Z-axis film 81 includes a large number of metal-filled pores 82, a large number of unfilled pores 83, and a substantial area 84 without pores, achieved by masking the area during the pore-forming procedure.

Figure 13:
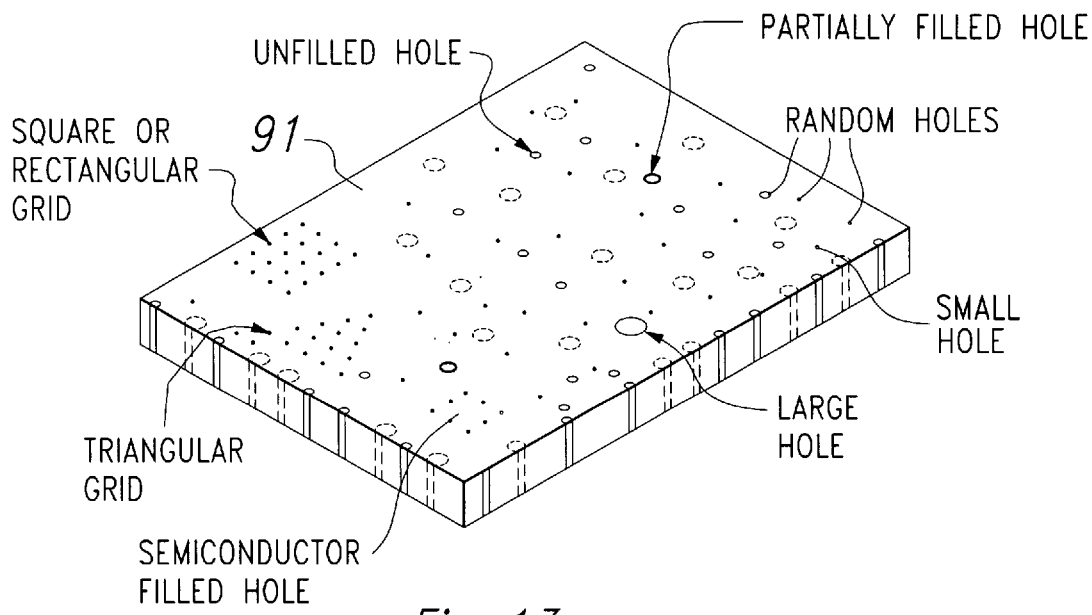
FIG. 13 is a perspective view of a conceptual composite of a Z-axis conductive film, useful in accordance with the invention, showing numerous pore variations and combinations.

As shown in FIG. 13, Z-axis conductive film 91 includes a variety of pore configurations, and a variety of pore contents. Specifically, film 91 includes an area of random pore distribution, a rectangular grid array of metal-filled pores, a triangular grid array of metal-filled pores, a square pattern of semiconductor-filled pores, a number of unfilled pores, and a number of partially-filled pores, illustrating conceptually that a multiplicity of combinations and permutations are within the scope of the invention.

What is claimed is:

1. First and second electronic parts interconnected by a nonconductive nanoporous film having first and second parallel surfaces, said film having metal-filled pores extending through the entire thickness of the film, such that each of said parts is contacted by the metal in at least several pores, a number of said pores being perpendicular to the surfaces of the film, and other of said pores being oblique to the surfaces of the film, whereby thermal dissipation is enhanced in the plane of the film.

2. A first electronic part having first ohmic contact pads thereon; a second electronic part having second ohmic contact pads thereon; and a nanoporous film therebetween, said film having metal fibrils extending through the entire film thickness, within selected pores therein, one end of said fibrils in contact with selected ones of said first ohmic contact pads, and the other end of said fibrils in contact with selected ones of said second ohmic contact pads, a number of said pores being perpendicular to the surfaces of the film, and other of said pores being oblique to the surfaces of the film, whereby thermal dissipation is enhanced in the plane of the film.

3. An integrated circuit chip having first ohmic contact pads thereon; a printed circuit board having second ohmic contact pads thereon; and means for interconnecting said first and second ohmic contact pads, comprising a nanoporous film having selected pores filled with nanometal fibrils extending through the complete thickness of said film, a number of said pores being perpendicular to the surfaces of the film, and other of said pores being oblique to the surfaces of the film.

4. An assembly of parts comprising a nanoporous film having selected orthogonal pores filled with metal extending through the entire film thickness; a first electronic part having first ohmic contacts touching said metal at one surface of the film, and a second electronic device having second ohmic contacts touching said metal at the opposite surface of said film; and other pores extending through the entire film thickness of said film, oblique to the surfaces of the film, said oblique pores having therein a dielectric material that is thermally very conductive.

5. An assembly as in claim 4, wherein the spacing between adjacent ohmic contacts is much greater than the diameter of the largest metal-filled pore.

6. A packaged microcircuit device comprising a nanoporous film having selected orthogonal pores filled with metal fibrils; an integrated circuit chip having first contact pads touching one end of selected fibrils at one surface of said film; a package enclosing said film and said chip, the base of said package having second contact pads thereon touching the other end of said selected fibrils at the other surface of said film, respectively; electrical leads extending from said second pads, terminating outside the package, for connecting said circuit to other parts, said film having other pores therein, oblique to the surface of the film, filled with a thermally conductive material.

* * * * *